United States Patent [19]

Sanders

[11] 4,202,005

[45] May 6, 1980

[54] DISTRIBUTED COLLECTOR BALLAST RESISTOR STRUCTURE

[75] Inventor: Paul W. Sanders, Manhattan Beach, Calif.

[73] Assignee: TRW Inc., Los Angeles, Calif.

[21] Appl. No.: 962,122

[22] Filed: Nov. 20, 1978

[51] Int. Cl.² ............................................ H01L 27/02
[52] U.S. Cl. ........................................ 357/51; 357/13; 357/20; 357/36; 357/89
[58] Field of Search ........................ 357/51, 13, 20, 89, 357/36

[56] References Cited

U.S. PATENT DOCUMENTS 4,123,672   10/1978   Kasperkoritz ........................ 307/303

Primary Examiner—Martin H. Edlow
Attorney, Agent, or Firm—Martin R. Horn

[57] ABSTRACT

A distributed collector ballast resistor structure for use in a distributed collector contacted transistor comprises a diffusion geometry which is designed to employ a number of distributed collector ballast resistors in parallel as opposed to a single bulk resistor in series with the collector circuit thereby generating a lower current for a given voltage during avalanche while allowing lower saturation voltage, better RF gain and higher saturated output power.

7 Claims, 5 Drawing Figures

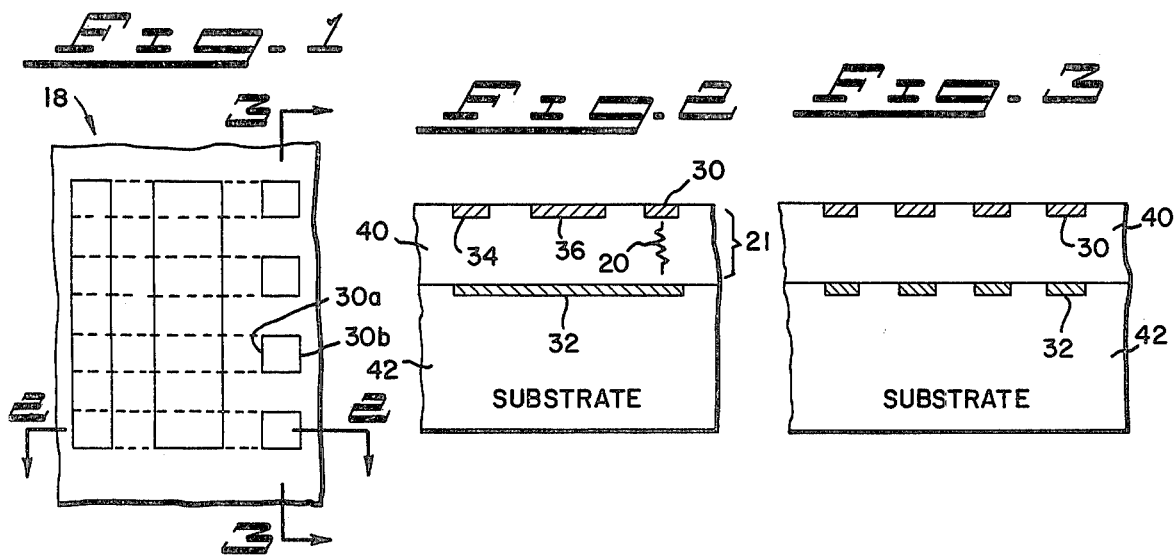
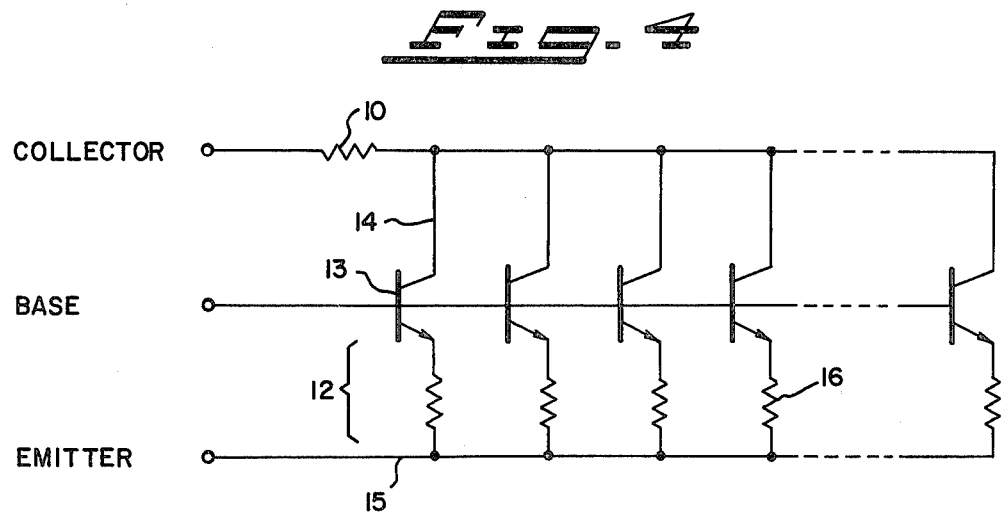
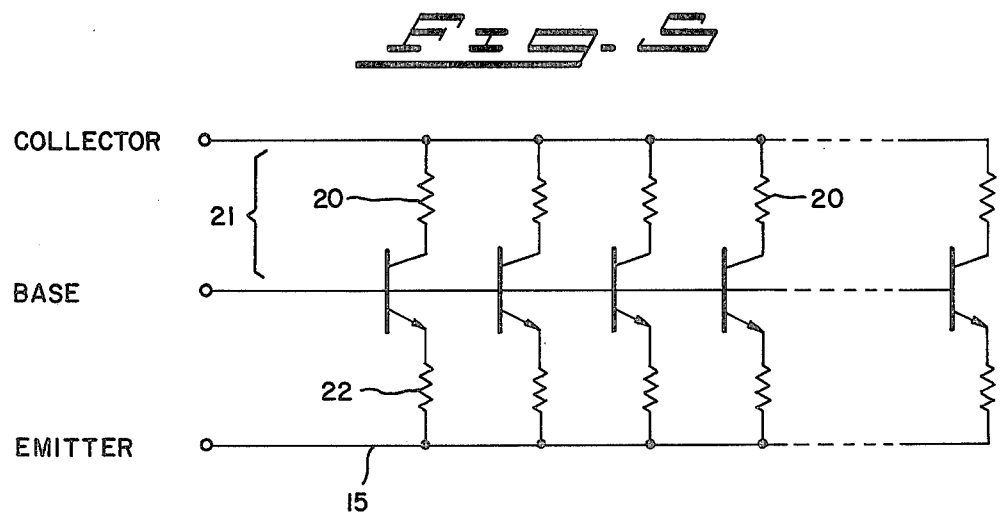

DISTRIBUTED COLLECTOR BALLAST RESISTOR STRUCTURE

BACKGROUND OF THE INVENTION

1. Field of the Invention

This invention relates to top collector contacted transistors, and more particularly, to the design of a distributed collector ballast resistor structure.

2. Prior Art

A main objective in the design of transistors is enhanced uniformity of power dissipation under collector-base junction reverse bias avalanche conditions.

Presently, the most effective method of limiting the current due to avalanche is to employ an epitaxial layer thickness greater than that required to support the depletion width. This thickness serves as a single bulk resistor in series with the collector circuit. One of the problems with this method is that a compromise must be struck between allowing low saturation voltage during normal operation and effecting lower current for a given voltage during avalanche.

It is therefore an object of this invention to provide a collector ballast resistor structure whereby a lower current is effected for a given voltage during avalanche while during normal operation allowing lower saturated voltage $V_{CE(SAT)}$, better RF gain and higher saturated output power relative to prior art designs.

SUMMARY OF THE INVENTION

The present invention comprises a unique three dimensional circuit structure which results in a distributed collector ballast resistor structure rather than a single bulk resistor as was provided by prior art circuit structures. By distributing the resistance through a plurality of resistors in parallel, a lower current is effected for a given voltage during avalanche and the power is dissipated over a larger area. The specific design employed herein to effect a distributed collector ballast resistor structure can be described as a type of crisscross grid. Parallel N+ buried collector strips are deposited on the surface of a substrate. Parallel emitter and base strips are then deposited on the surface of the epitaxial layer and oriented perpendicular to the buried N+ collector strips. Since the base and emitter strips are arranged to cover less than the full length of the buried N+ collector strips, a series of pads of N+ contacts may then be placed on the surface of the epitaxial layer directly above a portion of the buried N+ collectors. This configuration, explained in more detail below, allows the epitaxial layer to act as a series of resistors between the N+ contacts and the buried collectors, rather than as a single bulk resistor as in the prior art.

This configuration results in each collector resistance $R_c$ having a much higher resistance value than the bulk resistance $R_{EPI}$ of the prior art, thereby effecting lower current for a given voltage during avalanche and yet during normal operation of the device the parallel sum of the $R_c$ network is lower than $R_{EPI}$ of the prior art and allows lower $V_{CE(SAT)}$, better RF gain and higher saturated output power.

The novel features which are believed to be characteristic of the invention, both as to its organization and to its method of operation, together with further objectives and advantages thereof, will be better understood from the following description considered in connection with the accompanying drawings in which a presently preferred embodiment of the invention is illustrated by way of example. It is to be expressly understood, however, that the drawings are for the purpose of illustration and description only, and are not intended as a definition of the limits of the invention.

BRIEF DESCRIPTION OF THE DRAWINGS

FIG. 1 is an overhead view of the diffusion geometry for distributed collector ballast resistors of the present invention;

FIG. 2 is a cross-sectional view taken along line 2—2 of FIG. 1 of the diffusion geometry of the present invention;

FIG. 3 is a cross-sectional view taken along line 3—3 of FIG. 1 of the diffusion geometry of the present invention;

FIG. 4 is a circuit diagram of the resistor structure embodying the prior art;

FIG. 5 is a circuit diagram of the distributed collector ballast resistor structure embodying the present invention.

DETAILED DESCRIPTION OF THE INVENTION

The present invention, employing distributed collector ballast resistors rather than a single, bulk resistor as in the prior art, results in improvement in both the resistance value of the circuit (as computed by the parallel sum of the network) and the saturation voltage. The exact numerical values for these factors and even their orders of magnitude vary greatly depending on the physical dimensions of the transistor. The transistor size used for various purposes will vary greatly. However, experience has shown that the design of the present invention can be expected to yield lower values of saturation voltage and total resistance by a factor in excess of 25% as compared with prior art designs for comparable transistors.

Referring to FIGS. 1, 2 and 3, one can see the diffusion geometry 18 for distributed collector ballast resistors 20 of the present invention. The diffusion geometry area 18 comprises two layers, an $N^-_{EPI}$ layer 40 and a substrate layer 42. Embedded in the upper surface of the $N^-_{EPI}$ layer 40 are various surface components made of a conducting material.

One of these surface components is an emitter 34 in the form of a rectangular bar which is disposed along one side of the diffusion geometry area 18. Parallel to the emitter 34 and separated from it by part of the $N^-_{EPI}$ layer 40 in which it is embedded is the base 36. Base 36 is also rectangular with its longer side parallel to the longer side of the emitter 34. Disposed on the side of the base 36 opposite from the emitter 34 and also separated from the base 36 and from each other by $N^-_{EPI}$ layer 40 are a series of N+ contacts 30. Each contact 30 has a first side 30a and a second side 30b all of said sides 30a lying in a single straight line and all of said sides 30b lying in a single straight line, each of said sides 30a and 30b also being parallel to the longer side of base 36. These surface components are all disposed in an $N^-_{EPI}$ layer 40 such that their top surface is flush with the upper surface of the $N^-_{EPI}$ layer 40. The $N^-_{EPI}$ layer 40 extends down to an opposite flat bottom surface which is bonded to the upper surface of the substrate 42.

Embedded in the substrate 42 are a series of N+ buried collectors 32 rectangular in shape whose longer sides are all parallel to each other. The upper surface of the collectors 32 is flush with the upper surface of the substrate 42 and bonded to the bottom surface of the $N^-_{EPI}$ layer 40.

The collectors are disposed in such a way that one short side of each collector 32 is beneath and in substantial alignment with the outside longer side of the emitter 34. The collectors 32, separated from one another by substrate 42 in which they are embedded, also extend beneath the emitter 34, beneath the base 36 and continue underneath the contacts 30. The collectors 32 are disposed such that the longer side of each collector 32 is perpendicular to the longer side of both the emitter 34 and the base 36. The width of the collector 32 is equal to the width of the contact 30 which it is beneath. The collectors are disposed such that three sides of the collector 32 are in substantial over and under alignment with a corresponding side of contact 30 and separated by the EPI layer from said contacts.

This new diffusion geometry effects a lower avalanche current and yet results in better RF gain and higher saturated power output.

FIG. 4 is a circuit diagram of the resistor structure embodying the prior art. This type circuit resulted from a design wherein there was a single collector rather than the discrete, distributed collectors of the present invention. Thus, the effect was that there was a single, bulk resistor between the collector and the bases.

Reffering to FIG. 4 it is clear that under the prior art the collector ballast resistor design was such that there was a single, bulk resistor 10 in series with the collector circuit 14 which led to the base 13 then to the emitter circuit 12 comprising a number of resistors 16 in parallel and then to the emitter 15. This resulted in the undersirable characteristics described earlier. That is, with a single, bulk resistor, compromise must be struck between allowing low saturation voltage during normal operation and effecting lower current for a given voltage during avalanche. Neither value could be optimized by raising or lowering the resistance value without adversely affecting the other.

FIG. 5 is a circuit diagram of the distributed collector ballast resistor structure embodying the present invention. The discrete resistors, each $R_c$ 20, are formed by the epitaxial layer 40 between the base 36 and the buried collectors 32. These resistors 20 are all in parallel. Since the inverse of the total parallel resistance of the circuit 21 is equal to the sum of the inverses of the individual resistors, $R_c$ 20, the value of the individual resistors, $R_c$ 20, can be individually raised while maintaining a lower total resistance for the parallel circuit 21.

Instead of a single bulk resistor 10 as used in the prior art, the collector circuit 21 of the present invention comprises a number of resistors 20 in parallel. The circuitry from the base 13 to the emitter 15 is the same as in the prior art. The geometry 18 of the present invention as shown in FIG. 2 allows the EPI layer 40 to act as a collector resistor 20 between each contact 30 and the buried collector 32 over which it is aligned. The rest of the design allows the circuit to be completed through the base 30 to the emitter 34.

The value of the collector resistor ($R_c$) 20 can be adjusted by controlling the depth of the N+ collector diffusion 21. The buried collectors 32 function as discrete conductors to the area under the N+ collector contacts 30, and the epitaxial layer 40 therebetween serves as the resistive material of $R_c$ 20. The value of $R_c$ 20 can thus be adjusted so that each $R_c$ 20 of the present invention as shown in FIG. 5 has a much higher resistive value than the $R_{EPI}$ 10 of the prior art as shown in FIG. 4, yet the parallel sum of the $R_c$ network 21 is lower in value that $R_{EPI}$ 10. As discussed previously, the design of the present invention allows an improvement of at least 25% over the prior art in terms of a lower parallel sum of resistance, for a given saturation voltage. Of course, actual figures vary greatly, depending on the size and type of transistor.

It is to be understood that the above description is merely a description of the preferred embodiment of the device of the present invention. Many modifications and changes in structure and materials can be made to the specific device disclosed without departing from the spirit and scope of this invention. For example, it is well known that by suitable changes N type and P type materials may be substituted one for the other. Thus, the use of N and P type materials could be reversed throughout, replacing N by P wherever it is used and similarly P by N. The circuit described in the detailed description and depicted by the drawings is a top contacted collector circuit. The present invention is not limited to such a configuration. For example bottom contacted collectors are also possible. In addition, it should be noted that all transistors suffer the problems described above and so the present invention is not limited to any one type of transistor. It should be understood that the invention is not to be limited to the specific embodiment disclosed herein, but rather is intended to be limited only by the scope of the appended claims.

What is claimed is:

1. In a distributed collector contacted transistor, a distributed collector ballast resistor structure comprising:
   a semiconductive substrate layer;
   a plurality of collector regions disposed in the surface of said substrate;
   an epitaxial layer bonded to the surface of said substrate and collector regions;
   an emitter region disposed in the surface of said epitaxial layer and extending above each collector region;
   a base region disposed in the surface of said epitaxial layer and extending above each collector region;
   a plurality of collector contacts, each such contact being disposed in the surface of said epitaxial layer and above a respective collector region.

2. A distributed collector ballast resistor structure according to claim 1 wherein said distributed collector ballast resistors are circuited in parallel between the collectors and said contacts.

3. A distributed collector ballast resistor structure for use in a top collector contacted RF power transistor comprising:
   (a) an upper N- (or P-) epitaxial layer embedded in the top surface of which are a rectangular emitter and a base and a row of square N+ (or P+) contacts; and
   (b) a lower substrate layer embedded in the top surface of which are a number of rectangular N+ (or P+) buried collector regions.

4. A distributed collector ballast resistor structure according to claim 3 wherein said emitter, base, collector, and contacts are all made of conducting material.

5. A distributed collector ballast resistor structure according to claim 3 wherein the long sides of said emitter, base, and row of contacts are all parallel to each other.

6. A distributed collector ballast resistor structure according to claim 3 wherein the long sides of said rectangular collectors are perpendicular to the long sides of said emitter, base, and row of contacts.

7. A distributed collector ballast resistor structure according to claim 3 wherein said collectors pass underneath and from said emitter to said base and on to beneath one of said contacts separated therefrom by said $N^-$ (or $P^-$) epitaxial layer.

* * * * *